United States Patent
Goumas et al.

(10) Patent No.: US 9,438,200 B2
(45) Date of Patent: Sep. 6, 2016

(54) COMPACT BROADBAND IMPEDANCE TRANSFORMER

(71) Applicant: Teledyne Wireless, LLC, Thousand Oaks, CA (US)

(72) Inventors: William Goumas, Rancho Cordova, CA (US); Yehuda G. Goren, Scotts Valley, CA (US)

(73) Assignee: TELEDYNE WIRELESS, LLC, Thousand Oaks, CA (US)

( * ) Notice: Subject to any disclaimer, the term of this patent is extended or adjusted under 35 U.S.C. 154(b) by 118 days.

(21) Appl. No.: 14/226,337

(22) Filed: Mar. 26, 2014

(65) Prior Publication Data

US 2015/0280685 A1    Oct. 1, 2015

(51) Int. Cl.
*H03H 7/38* (2006.01)
*H01P 1/203* (2006.01)

(52) U.S. Cl.
CPC .......... *H03H 7/383* (2013.01); *H01P 1/203* (2013.01); *H03H 2007/386* (2013.01)

(58) Field of Classification Search
CPC .................................................. H03H 7/383
USPC ........................................................ 333/35
See application file for complete search history.

(56) References Cited

U.S. PATENT DOCUMENTS

| | | | |
|---|---|---|---|
| 3,551,855 A * | 12/1970 | Seidel ............... | H01P 5/02 333/33 |
| 6,650,877 B1 * | 11/2003 | Tarbouriech ...... | G06F 17/30876 455/186.1 |
| 9,007,142 B1 * | 4/2015 | Ozard ............... | H03F 1/0288 330/124 R |
| 2003/0030504 A1 | 2/2003 | Dixit et al. | |
| 2009/0027141 A1 * | 1/2009 | Oshima ............ | H03H 7/1708 333/204 |

FOREIGN PATENT DOCUMENTS

| | | |
|---|---|---|
| EP | 1168604 A1 | 1/2002 |
| EP | 2634918 A2 | 9/2013 |

OTHER PUBLICATIONS

European Search Report dated Sep. 24, 2015 for corresponding European Application No. 15160737.1.
Yanjie Wang et al: "A transformer-based broadband I/O matchingbalun-T/R switch front-end combo scheme in standard CMOS", Custom Integrated Circuits Conference (CICC), 2011 IEEE, Sep. 19, 2011, pp. 1-4, XP032063732, DOI: 10.11 09/CICC.2011.6055284 ISBN: 978-1-4577-0222-8.
"RF Electronics Chapter 7: RF Filters", Mar. 18, 2009, XP055128615, Retrieved from the Internet: URL: http:/1151.1 00.120.244/personale/pisa/CIRCUITI_MICROONDE/VARIE/ LIBRI/Kikkert_RF Eiectronics_Course/09-RF Eiectronics_Kikkert_Ch7 RFFiltersPart1.pdf [retrieved on Jul. 14, 2014] RF Lowpass Filters Design; p. 8-9; Figures 10, 11.
Boeck Get al: "Two-Stage Ultrawide-Band 5-W Power Amplifier Using SiC MESFET", IEEE Transactions on Microwave Theory and Techniques, IEEE Service Center, Piscataway, NJ, US, vol. 53, No. 7,Jul. 1, 2005, pp. 2441-2449, XP011136031, ISSN: 0018-9480, DOI: 10.11 09/TMTT.2005.850404.
Shor A Ed—Institute of Electrical and Electronics Engineers: "Broadbanding techniques for TEM N-way power dividers", International Microwave Symposium. New York, May 25-27, 1988; [International Microwave Symposium], New York, IEEE, US, May 25, 1988, pp. 657-659, XP01 0069956.

* cited by examiner

*Primary Examiner* — Stephen E Jones
*Assistant Examiner* — Scott S Outten
(74) *Attorney, Agent, or Firm* — K&L Gates LLP

(57) ABSTRACT

In various embodiments, a broadband matching circuit is disclosed. In one embodiment, the broadband matching circuit comprises a low-pass matching section, a quarter-wavelength transformer, and a high-pass matching section.

20 Claims, 8 Drawing Sheets

COMPACT BROADBAND IMPEDANCE TRANSFORMER

BACKGROUND

Multi-octave performance in broadband matching networks is currently achieved primarily by two methods. In one method, coaxial transformers and ferrite loading are used for matching circuits. Coaxial transformers and coaxial loading are limited to frequencies below about 600 MHz. In a second method, a device is matched only in the high end of a 20 MHz to 1.5 GHz range. High-end matching results in mismatching of the device at the low end of the desired range. The inherit gain and efficiency of a typical Gallium Nitride (GaN) device is so large that gain and efficiency when degraded due to mismatch is still very good. This degradation is only suitable for large gain and efficiency devices. High end matching is limited to frequencies below 1.5 GHz and power levels below about 20 W. Compact devices have not been developed which can provide broadband matching in a compact circuit.

SUMMARY

In various embodiments, a broadband matching circuit is disclosed. The broadband matching circuit comprises a low-pass matching section, a quarter-wavelength transformer, and a high-pass matching section.

In various embodiments, a radio frequency transmission system is disclosed. The transmission system comprises a signal source, a broadband matching circuit in signal communication with the signal source, and a radiofrequency transmitter in signal communication with the broadband matching circuit. The broadband matching circuit comprises a low-pass matching section, a quarter-wavelength transformer in signal communication with the low-pass matching section, and a high-pass matching section in signal communication with the quarter-wavelength transformer.

In various embodiments, a radio frequency receiver system is disclosed. The receiver system comprises a radiofrequency receiver, a broadband matching circuit in signal communication with the receiver, and a signal output in signal communication with the broadband matching circuit. The broadband matching circuit comprises a high-pass matching section, a quarter-wavelength transformer in signal communication with the high-pass section, and a low-pass matching section in signal communication with the quarter-wavelength transformer.

DRAWINGS

The features of the various embodiments are set forth with particularity in the appended claims. The various embodiments, however, both as to organization and methods of operation, together with advantages thereof, may best be understood by reference to the following description, taken in conjunction with the accompanying drawings as follows:

DESCRIPTION

Reference will now be made in detail to several embodiments, including embodiments showing example implementations of compact broadband multi-octave matching networks. Wherever practicable similar or like reference numbers may be used in the figures and may indicate similar or like functionality. The figures depict example embodiments of the disclosed systems and/or methods of use for purposes of illustration only. One skilled in the art will readily recognize from the following description that alternative example embodiments of the structures and methods illustrated herein may be employed without departing from the principles described herein.

Figure 1:
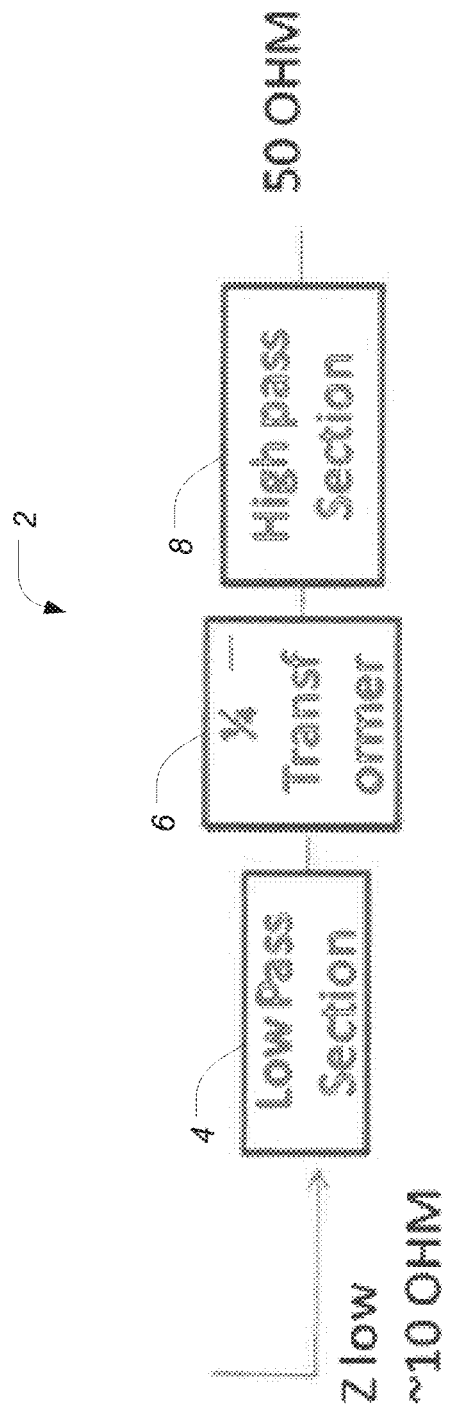
FIG. 1 illustrates a block diagram of one embodiment of a compact broadband multi-octave matching network.

FIG. 1 illustrates a block diagram of one embodiment of a compact broadband multi-octave matching network 2. The compact broadband multi-octave matching network 2 comprises a low-pass matching section 4, a transformer section 6, and a high-pass matching section 8. The compact broadband multi-octave matching network 2 provides a multi-octave high power amplifier stage for a communication network. The combination of the low-pass matching section 4, the transformer section 6, and the high-pass matching section 8 allows a multi-octave match to a low impedance and/or a high impedance.

In some embodiments, the transformer section 6 comprises a quarter-wavelength transformer. In other embodiments, the transformer section 6 may comprise any suitable quarter-wavelength transformer equivalent. The transformer section 6, coupled with the low-pass matching section 4 and the high-pass matching section 8, provide multi-octave matching at low-impedance for a radiofrequency (RF) signal. For example, in one embodiment comprising a quarter-wavelength transformer, the compact broadband multi-octave matching network provides a 100 W output at 28-50V operation. The output and operation levels may be adjusted by modifying the low-pass matching section 4, the transformer section 6 and/or the high-pass matching section 8.

In some embodiments, the low-pass matching section 4 comprises one or more circuit elements configured for low-pass impedance matching, such as, for example, transmission lines and/or lump circuit elements. For example, in some embodiments, the low-pass matching section 4 comprises one or more microwave transmission lines, such as, for example, a microstrip transmission line, a coaxial transmission line, a multi-dielectric coaxial transmission line, a slotline, a stripline, or any other suitable microwave transmission line. The low-pass matching section 4 is configured to perform low-pass impedance matching of an input signal, such as, for example, a signal having a 10Ω input impedance.

In some embodiments, the high-pass matching section 8 comprises one or more circuit elements configured for high-pass impedance matching, such as, for example, transmission lines and/or lump circuit elements. For example, in some embodiments, the high-pass matching section 8 comprises a microwave transmission line, such as, for example, a microstrip transmission line, a coaxial transmission line, a multi-dielectric coaxial transmission line, a slotline, a stripline, or any other suitable microwave transmission line. In some embodiments, the high-pass matching section 8 comprises one or more lump circuit elements, such as, for example, a resistor, a capacitor, an inductor, and/or any other suitable lump circuit element. The high-pass matching section 8 is configured to perform high-pass impedance matching to generate an output signal, such as, for example, an output signal having a 50Ω impedance. Although the embodiment illustrated in FIG. 1 illustrates the low-pass matching section 4, the transformer section 6, and the high-pass section 8 in a specific order, those skilled in the art will recognize that the low-pass matching section 4, the transformer section 6, and the high-pass matching section 8 may be arranged in any order.

Figure 2:
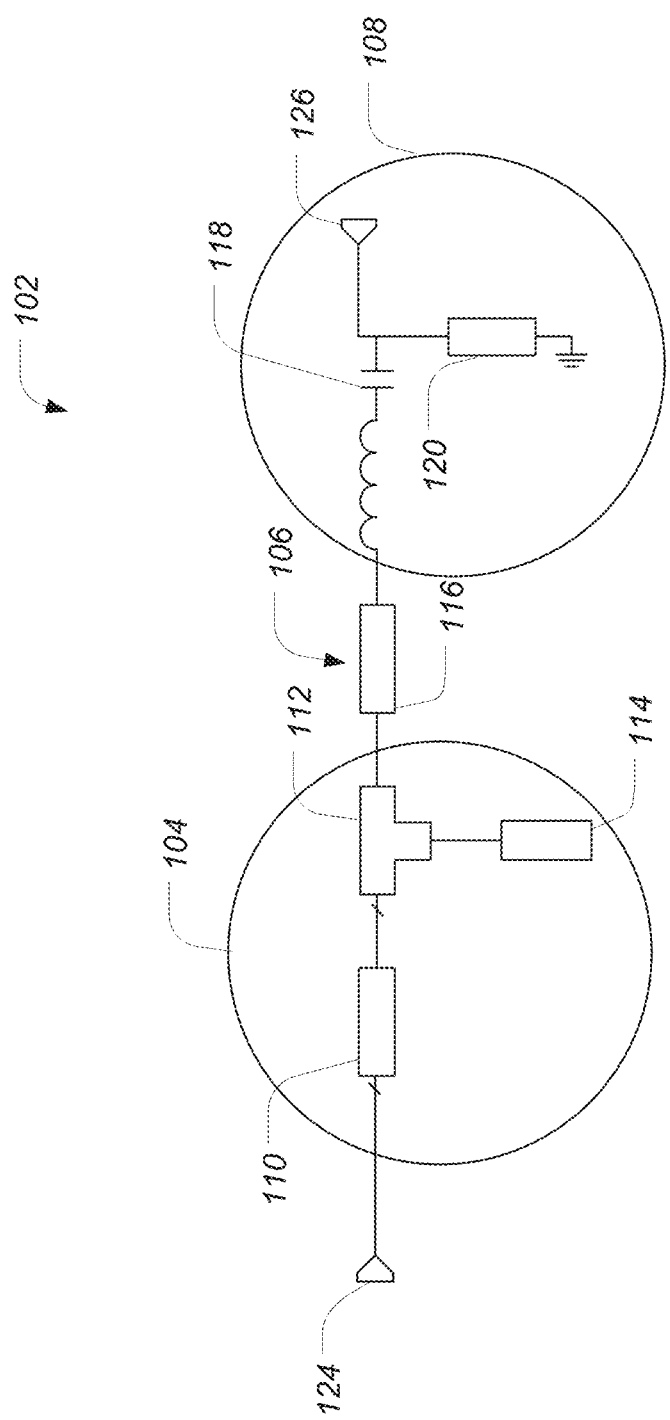
FIG. 2 illustrates one embodiment of a compact broadband multi-octave matching network circuit layout.

FIG. 2 illustrates one embodiment of a compact broadband multi-octave matching network circuit layout 102. The circuit layout 102 comprises a low-pass matching section 104, a transformer section 106, and a high-pass matching section 108. The compact broadband multi-octave matching network circuit layout 102 provides a multi-octave high power amplifier stage for a communication network. The combination of the low-pass matching section 104, the transformer section 106, and the high-pass matching section 108 results in a multi-octave match to a low impedance. The low-pass matching section 104, the transformer section 106, and the high-pass matching section 108 each comprise one or more electrical components, such as, for example, lump circuit elements, microwave transmission lines, and/or any other suitable electrical component.

The low-pass matching section 104 comprises a plurality of microwave transmission lines 110-114. The plurality of microwave transmission lines 110-114 may comprise, for example, microstrip transmission lines. A first microstrip transmission line 110 is coupled to an input 124. A transmission line T-junction 112 is coupled to the first microstrip transmission line 110, a microstrip open-ended stub 114, and a transformer section 106.

The transformer section 106 comprises a quarter-wavelength impedance transformer 116. The quarter-wavelength impedance transformer 116 may comprise any suitable quarter-wavelength impedance transformer, such as, for example, a microwave transmission line and/or a waveguide. The quarter-wavelength impedance transformer 116 comprises a length of about one quarter of a wavelength of a signal and terminates in a known impedance. An output of the quarter-wavelength impedance transformer 116 is coupled to a high-pass matching section 108.

The high-pass matching section 108 is configured to perform high-pass impedance matching of a signal received from the transformer section 106. The high-pass matching section 108 comprises a capacitor 118 and a microwave transmission line 120. The capacitor 118 may have a parasitic inductance. The capacitor 118 may comprise any suitable capacitance and may have a parasitic inductance. The capacitor 118 is coupled to a microwave transmission line 120. The microwave transmission line 120 may comprise, for example, a microstrip shorted stub. The high-pass section 108 may provide the transformed signal to a communication system for further processing, such as, for example, a transmitter of an RF communication system for transmission over an RF channel.

The compact broadband impedance transformer network 102 comprises an input 124 and an output 126. The input 124 comprises an input configured to receive a signal from, for example, a communication system. The input 124 provides, for example, a 10Ω input to the low-pass matching section 104. An output 126 is coupled to the high-pass matching section 108. The output 126 comprises, for example, a 50Ω output configured to provide a signal to, for example, a communication system. Those skilled in the art will recognize that the impedances of the input 124 and the output 126 may be adjusted based on the components of the compact broadband impedance transformer network 102 and/or the communications network coupled thereto.

Figure 3:
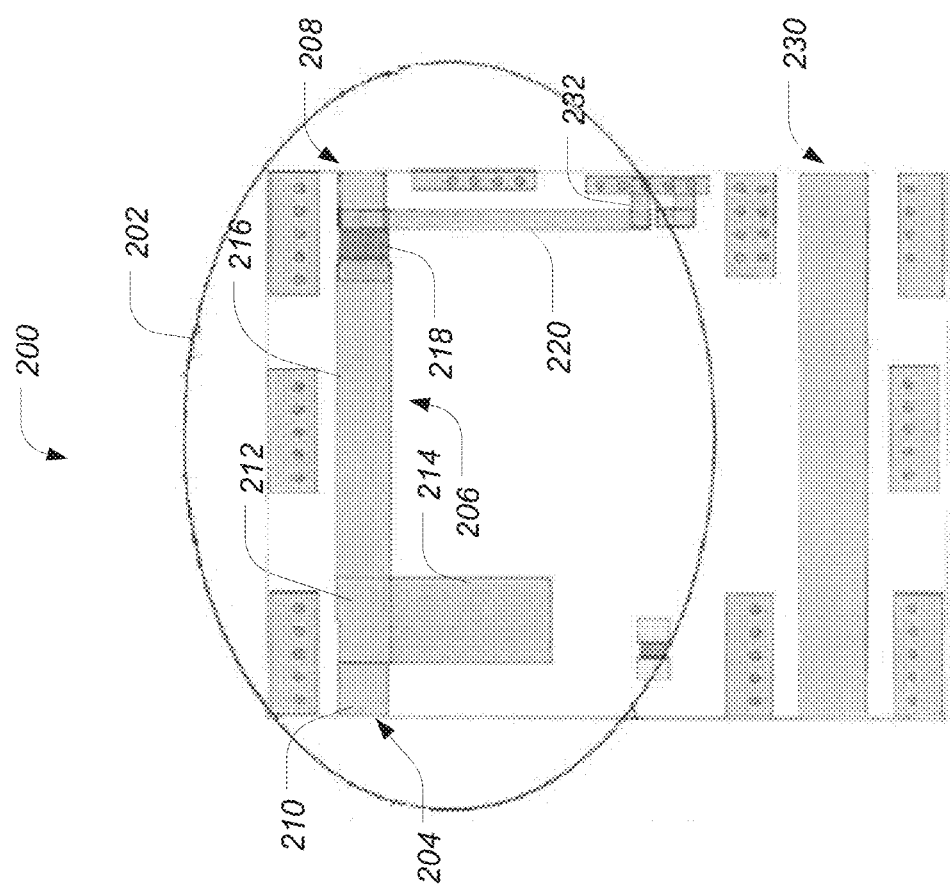
FIG. 3 illustrates one embodiment of a physical layout of the compact broadband multi-octave matching network of FIG. 2.

FIG. 3 illustrates one embodiment of a physical layout 200 of the compact broadband impedance transformer network 102 illustrated in FIG. 2. The physical layout comprises a compact broadband impedance transformer network 202. A ¼λ transformer 230 is illustrated for comparison. The compact broadband impedance transformer network 202 comprises a low-impedance end 224 and a high-impedance end 226. A low-pass matching section 204 is located at the low-impedance end 224. The low-pass matching section 204 comprises a first microstrip transmission line 210 having a width of 110 mils and length of about 117 mils coupled to an input. A transmission line T-junction 212 is coupled to the first microstrip transmission line 210, a microstrip open-ended stub 214, and a transformer section 206. The microstrip open-ended stub 214 comprises a width of about 185 mils and a length of about 365 mils.

The high-impedance end 226 comprises a high-pass matching section 208. The high-pass matching section 208 comprises a capacitor 218 coupled to a microstip shorted stub 220. The capacitor 218 comprises a capacitance of about 3 pF and a parasitic inductance of about 0.8 nh. The microstip shorted stub 220 comprises a width of about 40 mils and a length of about 740 mils. The microstrip shorted stub 220 is coupled to a ground pin 232. The low-impedance end 224 and the high-impedance end 226 are coupled by a transformer section 206. The transformer section 206 comprises a microstrip transmission line 216 having a width of about 125 mils and a length of about 732 mils.

Figure 4:
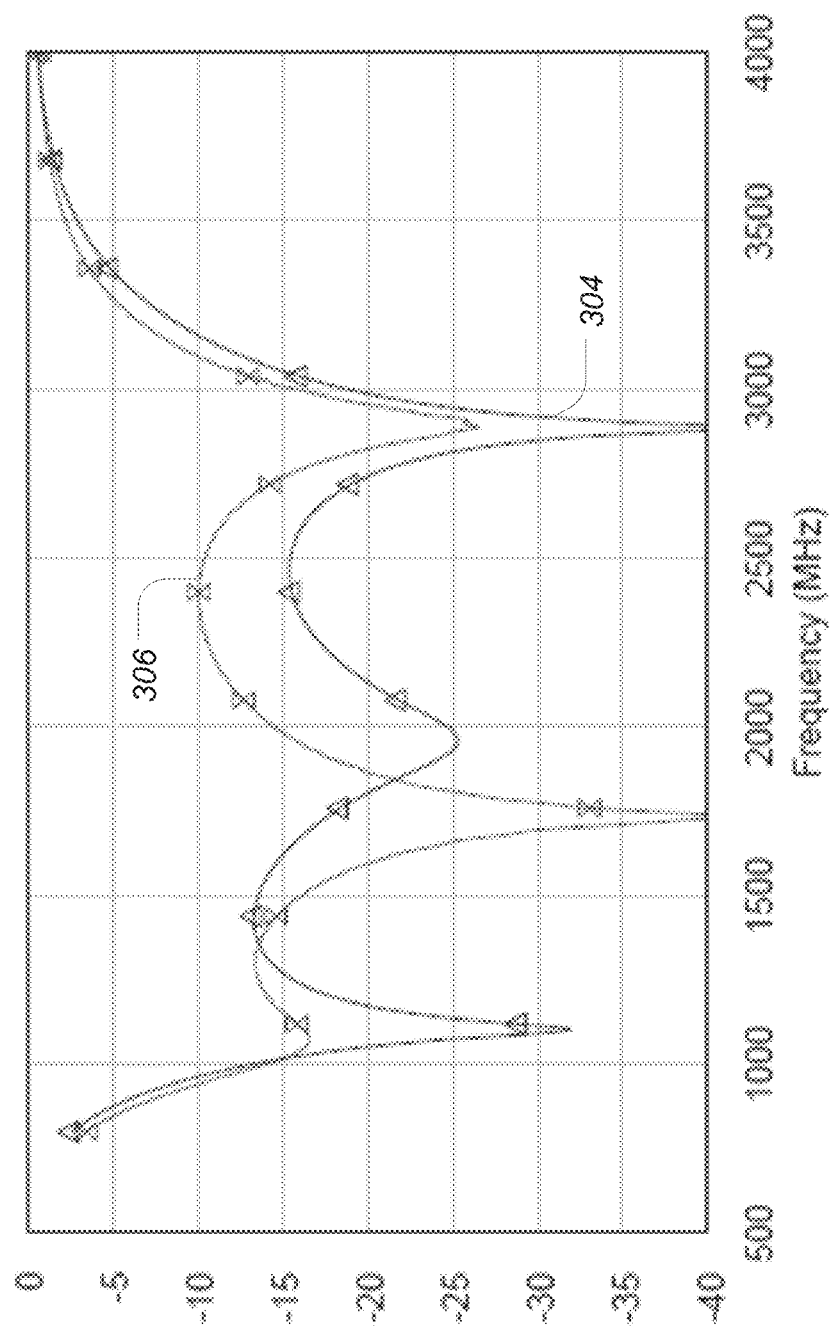
FIG. 4 is a graph illustrating return loss for the broadband matching circuit of FIG. 3.
Figure 5A:
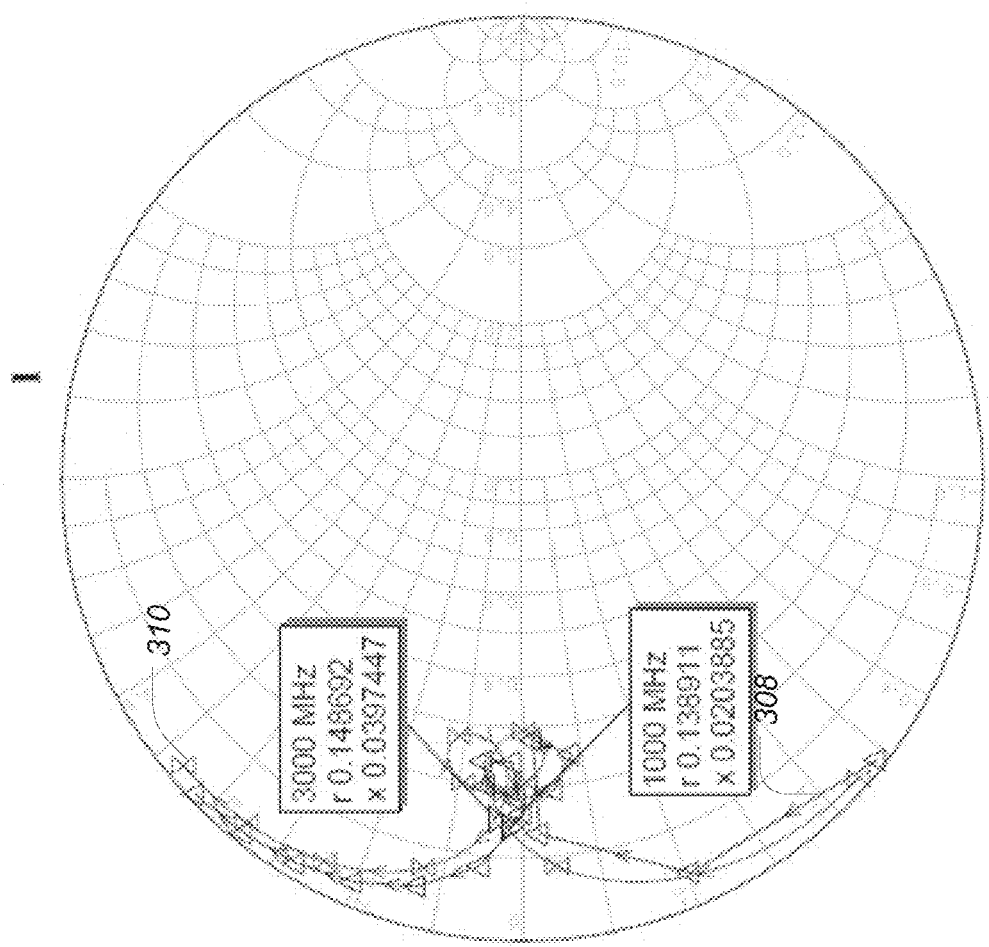
FIG. 5A is a graph illustrating one embodiment of impedance of the broadband matching circuit of FIG. 3.
Figure 5B:
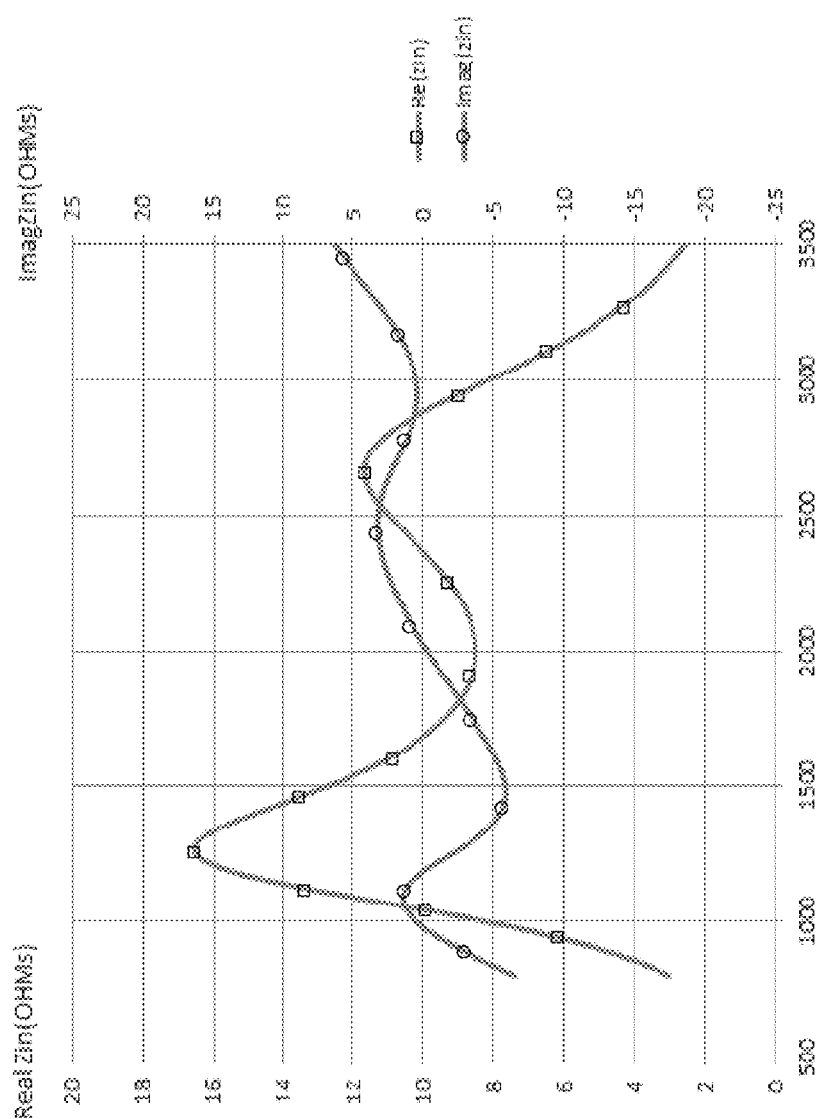
FIG. 5B is an alternative view of the impedance of the broadband matching circuit of FIG. 3.

FIG. 4 is a graph illustrating the return loss of the compact broadband impedance transformer network 202 of FIG. 3. A return loss 304 for a simulated compact broadband impedance transformer network 202 and a return-loss 306 measured for the compact broadband impedance transformer network 202 are illustrated. As shown in FIG. 4, the measured 306 and simulated 304 performance of the compact broadband impedance transformer network 202 is similar. FIG. 5A illustrates the impedance of the compact broadband impedance transformer network 202. As shown in FIG. 5, the impedance 308 of the simulated compact broadband impedance transformer network 202 is similar to the measured impedance 310 of the compact broadband impedance transformer network 202. FIG. 5B illustrates an alternative view of the simulated impedance 308 and the measured impedance 310 of the broadband impedance transformer network 202.

Figure 6:
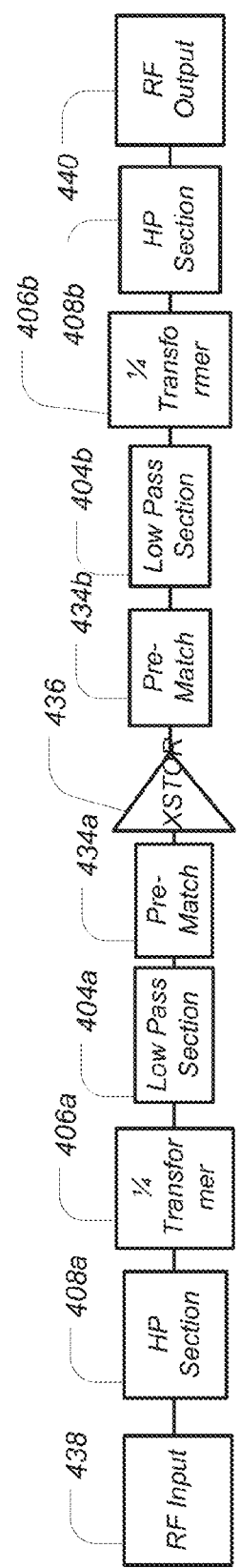
FIG. 6 illustrates one embodiment of a communication system comprising a broadband multi-octave matching network.

FIG. 6 illustrates one embodiment of a communications network 400 comprising a first compact broadband impedance transformer network 402a on a receive-side and a second compact broadband impedance transformer network 402b on a transmit-side. An RF signal is received at an RF-input 438 coupled to the first compact broadband impedance transformer network 402a at a first high-pass matching section 408a. The first high-pass matching section 408a performs high-pass impedance matching on the received signal and provides the signal to a first quarter-wavelength transformer 406a. The first quarter-wavelength transformer 406a transforms the received signal and provides the transformed signal to a first low-pass matching section 404a. The first low-pass matching section 404a performs low-pass impedance matching on the signal and provides the signal to a pre-match section 434a. The pre-match section 434a provides the signal to a processing section 436 for additional signal processing.

On a transmit side, a signal is received from the signal processing section 436 to a second compact broadband impedance transformer network 402b. The signal is received from the signal processing section 436 to a second pre-match section 434b. The second pre-match section 434b performs the reverse of the match performed by the first pre-match section 434a. The second pre-match section 434b provides the signal to a second low-pass matching section 404b. The second low-pass matching section 404b performs low-pass impedance matching of the signal and provides the signal to a second quarter-wavelength transformer 406b, which transforms the provided signal and passes the signal to a high-pass matching section 408b. The high-pass matching section 408b performs high-pass impedance matching and provides the transformed signal to an RF output 440, for example, transmission to an RF channel.

Figure 7:
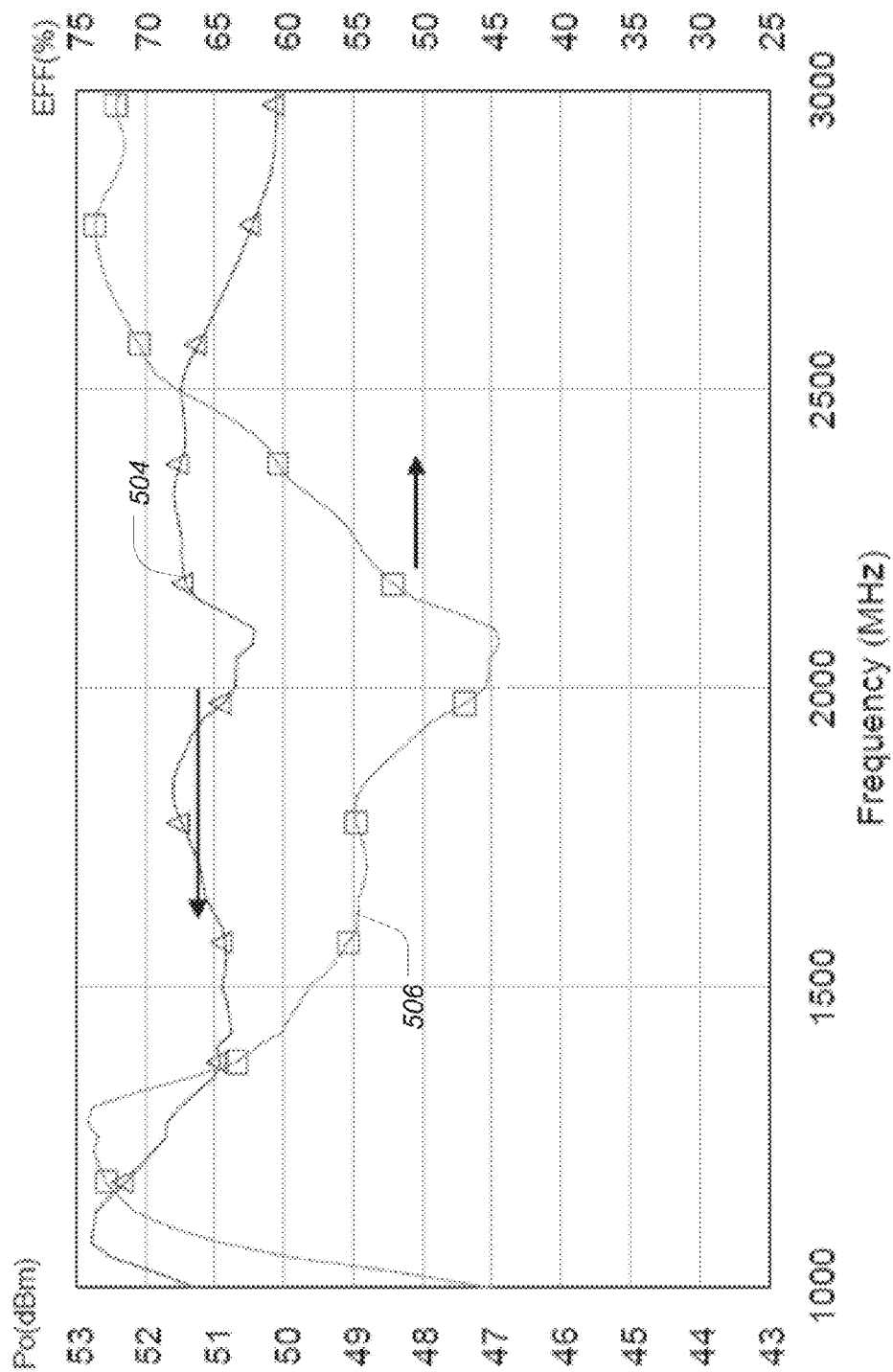
FIG. 7 is a graph illustrating large signal output and efficiency for the communication system of FIG. 6.

FIG. 7 is a graph illustrating power output 504 and efficiency 506 for a large signal simulation of the compact broadband impedance transformer network 402a. The power output 504 shows a >50 dBm (100 W) over the entire range of 1 GHz to 3.0 GHz. The efficiency 506 is >45% for the entire range of 1 GHz to 3.0 GHz. In some embodiments, adding a balun and push-pull topolgy may double the power of an amplifier stage and provide a bandwidth increase of about 20% of a transmission network utilizing a compact broadband impedance transformer network.

It is worthy to note that any reference to "one aspect," "an aspect," "one embodiment," or "an embodiment" means that a particular feature, structure, or characteristic described in connection with the aspect is included in at least one aspect. Thus, appearances of the phrases "in one aspect," "in an aspect," "in one embodiment," or "in an embodiment" in various places throughout the specification are not necessarily all referring to the same aspect. Furthermore, the particular features, structures or characteristics may be combined in any suitable manner in one or more aspects.

Some aspects may be described using the expression "coupled" and "connected" along with their derivatives. It should be understood that these terms are not intended as synonyms for each other. For example, some aspects may be described using the term "connected" to indicate that two or more elements are in direct physical or electrical contact with each other. In another example, some aspects may be described using the term "coupled" to indicate that two or more elements are in direct physical or electrical contact. The term "coupled," however, also may mean that two or more elements are not in direct contact with each other, but yet still co-operate or interact with each other.

Although various embodiments have been described herein, many modifications, variations, substitutions, changes, and equivalents to those embodiments may be implemented and will occur to those skilled in the art. Also, where materials are disclosed for certain components, other materials may be used. It is therefore to be understood that the foregoing description and the appended claims are intended to cover all such modifications and variations as falling within the scope of the disclosed embodiments. The appended claims are intended to cover all such modification and variations.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those skilled in the art will recognize that "configured to" can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

Although various embodiments have been described herein, many modifications, variations, substitutions, changes, and equivalents to those embodiments may be implemented and will occur to those skilled in the art. Also, where materials are disclosed for certain components, other materials may be used. It is therefore to be understood that the foregoing description and the appended claims are intended to cover all such modifications and variations as falling within the scope of the disclosed embodiments. The following claims are intended to cover all such modification and variations.

In summary, numerous benefits have been described which result from employing the concepts described herein. The foregoing description of the one or more embodiments has been presented for purposes of illustration and description. It is not intended to be exhaustive or limiting to the precise form disclosed. Modifications or variations are possible in light of the above teachings. The one or more embodiments were chosen and described in order to illustrate principles and practical application to thereby enable one of ordinary skill in the art to utilize the various embodiments and with various modifications as are suited to the particular use contemplated. It is intended that the claims submitted herewith define the overall scope.

Various aspects of the subject matter described herein are set out in the following numbered clauses:

1. A broadband matching circuit, comprising: a low-pass matching section; a quarter-wavelength transformer; and a high-pass matching section, wherein the low-pass matching section and the high-pass matching section are in signal communication with the quarter-wavelength transformer.

2. The broadband matching circuit of clause 1, wherein the low-pass matching section comprises at least one microwave transmission line.

3. The broadband matching circuit of clause 2, comprising: a microwave transmission line; a microwave transmission line T junction in signal communication with the microwave transmission line; and an open ended stub in signal communication with the microwave transmission line T junction.

4. The broadband matching circuit of clause 1, wherein the high-pass matching section comprises: a capacitor; and at least one microwave transmission line in signal communication with the capacitor.

5. The broadband matching circuit of clause 4, wherein the at least one microwave transmission line comprises a shorted stub.

6. The broadband matching circuit of clause 1, wherein the quarter-wavelength transformer comprises a microwave transmission line.

7. The broadband matching circuit of clause 1, wherein the broadband matching circuit is coupled to a communications system.

8. The broadband matching circuit of clause 7, wherein the low-pass matching section is coupled to a 50 ohm source and the high-pass matching section is coupled to an output.

9. The broadband matching circuit of clause 7, wherein the high-pass matching section is coupled to a 50 ohm source and the low-pass matching section is coupled to an output.

10. A transmission system comprising: a signal source; a broadband matching circuit in signal communication with the signal source, the broadband matching circuit comprising: a low-pass matching section; a quarter-wavelength transformer in signal communication with the low-pass section; and a high-pass matching section in signal communication with the quarter-wavelength transformer; and a transmitter in signal communication with the broadband matching circuit.

11. The broadband matching circuit of clause 10, wherein the low-pass matching section comprises at least one microwave transmission line.

12. The broadband matching circuit of clause 11, comprising: a microwave transmission line; a microwave transmission line T junction in signal communication with the microwave transmission line; and an open ended stub in signal communication with the microwave transmission line T junction.

13. The broadband matching circuit of clause 10, wherein the high-pass matching section comprises: a capacitor; and at least one microwave transmission line in signal communication with the capacitor.

14. The broadband matching circuit of clause 13, wherein the at least one microwave transmission line comprises a shorted stub.

15. The broadband matching circuit of clause 10, wherein the quarter-wavelength transformer comprises a microwave transmission line.

16. A transmission system comprising: a receiver; a broadband matching circuit in signal communication with the receiver, the broadband matching circuit comprising: a low-pass matching section; a quarter-wavelength transformer in signal communication with the low-pass section; and a high-pass matching section in signal communication with the quarter-wavelength transformer; and a signal output in signal communication with the broadband matching circuit.

17. The broadband matching circuit of clause 16, wherein the low-pass matching section comprises at least one microwave transmission line.

18. The broadband matching circuit of clause 17, comprising: a microwave transmission line; a microwave transmission line T junction in signal communication with the microwave transmission line; and an open ended stub in signal communication with the microwave transmission line T junction.

19. The broadband matching circuit of clause 16, wherein the high-pass matching section comprises: a capacitor; and at least one microwave transmission line in signal communication with the capacitor.

20. The broadband matching circuit of clause 16, wherein the quarter-wavelength transformer comprises a microwave transmission line.

What is claimed is:

1. A broadband matching circuit, comprising:
   a low-pass matching section having an output;
   a quarter-wavelength transformer having an input and an output; and
   a high-pass matching section having an input, wherein the low-pass matching section and the high-pass matching section are in signal communication with the quarter-wavelength transformer; and
   wherein the output of the low-pass matching section is coupled to the input of the quarter-wavelength transformer; and
   wherein the output of the quarter-wavelength transformer is coupled to the input of the high-pass matching section.

2. The broadband matching circuit of claim 1, wherein the broadband matching circuit is coupled to a communications system.

3. The broadband matching circuit of claim 2, wherein the low-pass matching section is coupled to a 50 ohm source and the high-pass matching section is coupled to an output.

4. The broadband matching circuit of claim 2, wherein the high-pass matching section is coupled to a 50 ohm source and the low-pass matching section is coupled to an output.

5. The broadband matching circuit of claim 1, wherein the low-pass matching section comprises at least one microwave transmission line.

6. The broadband matching circuit of claim 5, comprising:
   a microwave transmission line;
   a microwave transmission line T junction in signal communication with the microwave transmission line; and
   an open ended stub in signal communication with the microwave transmission line T junction.

7. The broadband matching circuit of claim 1, wherein the high-pass matching section comprises:
   a capacitor; and
   at least one microwave transmission line in signal communication with the capacitor.

8. The broadband matching circuit of claim 7, wherein the at least one microwave transmission line comprises a shorted stub.

9. The broadband matching circuit of claim 1, wherein the quarter-wavelength transformer comprises a microwave transmission line.

10. A radiofrequency (RF) communication system comprising:
    a signal source;
    a broadband matching circuit in signal communication with the signal source, the broadband matching circuit comprising:
      a low-pass matching section having an output;
      a quarter-wavelength transformer having an input and an output, the quarter-wavelength transformer in signal communication with the low-pass matching section; and
      a high-pass matching section having an input, the high-pass matching section in signal communication with the quarter-wavelength transformer; and
    a RF transmitter in signal communication with the broadband matching circuit; and
    wherein the output of the low-pass matching section is coupled to the input of the quarter-wavelength transformer; and
    wherein the output of the quarter-wavelength transformer is coupled to the input of the high-pass matching section.

11. The broadband matching circuit of claim 10, wherein the low-pass matching section comprises at least one microwave transmission line.

12. The broadband matching circuit of claim 11, comprising:
    a microwave transmission line;
    a microwave transmission line T junction in signal communication with the microwave transmission line; and
    an open ended stub in signal communication with the microwave transmission line T junction.

13. The broadband matching circuit of claim 10, wherein the high-pass matching section comprises:
    a capacitor; and
    at least one microwave transmission line in signal communication with the capacitor.

14. The broadband matching circuit of claim 13, wherein the at least one microwave transmission line comprises a shorted stub.

15. The broadband matching circuit of claim 10, wherein the quarter-wavelength transformer comprises a microwave transmission line.

16. A radiofrequency (RF) communication system comprising:
    a RF receiver;
    a broadband matching circuit in signal communication with the receiver, the broadband matching circuit comprising:
      a low-pass matching section having an output, the low-pass matching section in signal communication with the quarter-wavelength transformer;

a quarter-wavelength transformer having an input and an output, the quarter-wavelength transformer in signal communication with the a high-pass matching section; and a high-pass matching section having an input; and a signal output in signal communication with the broadband matching circuit; and wherein the output of the low-pass matching section is coupled to the input of the quarter-wavelength transformer; and wherein the output of the quarter-wavelength transformer is coupled to the input of the high-pass matching section.

17. The broadband matching circuit of claim 16, wherein the low-pass matching section comprises at least one microwave transmission line.

18. The broadband matching circuit of claim 17, comprising:

a microwave transmission line;

a microwave transmission line T junction in signal communication with the microwave transmission line; and an open ended stub in signal communication with the microwave transmission line T junction.

19. The broadband matching circuit of claim 16, wherein the high-pass matching section comprises:

a capacitor; and at least one microwave transmission line in signal communication with the capacitor.

20. The broadband matching circuit of claim 16, wherein the quarter-wavelength transformer comprises a microwave transmission line.

* * * * *